US007246295B2

(12) United States Patent
Xu

(10) Patent No.: US 7,246,295 B2
(45) Date of Patent: Jul. 17, 2007

(54) TURBO DECODER EMPLOYING SIMPLIFIED LOG-MAP DECODING

(75) Inventor: Shuzhan Xu, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 507 days.

(21) Appl. No.: 10/412,906

(22) Filed: Apr. 14, 2003

(65) Prior Publication Data
US 2004/0205445 A1    Oct. 14, 2004

(51) Int. Cl.
*H03M 13/41* (2006.01)
*H03M 13/45* (2006.01)

(52) U.S. Cl. ............... 714/755; 714/780; 714/786; 714/794

(58) Field of Classification Search ........... 714/755, 714/786, 792, 794, 780, 795
See application file for complete search history.

(56) References Cited

U.S. PATENT DOCUMENTS

| | | | | |
|---|---|---|---|---|
| 4,811,346 A * | 3/1989 | Battail | ........................ | 714/792 |
| 5,181,209 A * | 1/1993 | Hagenauer et al. | ......... | 714/795 |
| 5,933,462 A * | 8/1999 | Viterbi et al. | ................ | 375/341 |
| 6,028,899 A * | 2/2000 | Petersen | ...................... | 375/341 |
| 6,233,290 B1 * | 5/2001 | Raphaeli | ...................... | 375/341 |
| 6,389,574 B1 * | 5/2002 | Belveze et al. | ............. | 714/795 |
| 6,597,743 B1 * | 7/2003 | Khayrallah et al. | ......... | 375/265 |
| 6,658,071 B1 * | 12/2003 | Cheng | ......................... | 375/348 |
| 6,700,937 B1 * | 3/2004 | Turin | ........................... | 375/262 |
| 7,031,406 B1 * | 4/2006 | Li et al. | ...................... | 375/341 |
| 2001/0054170 A1 * | 12/2001 | Chass et al. | ................. | 714/796 |
| 2002/0124227 A1 * | 9/2002 | Nguyen | ....................... | 714/786 |
| 2002/0162074 A1 * | 10/2002 | Bickerstaff | ................... | 714/792 |
| 2003/0002603 A1 * | 1/2003 | Worm et al. | ................. | 375/341 |
| 2003/0101402 A1 * | 5/2003 | Amrani et al. | .............. | 714/755 |
| 2003/0154441 A1 * | 8/2003 | Nieminen | .................... | 714/786 |
| 2004/0005019 A1 * | 1/2004 | Smith et al. | ................. | 375/341 |
| 2005/0198551 A1 * | 9/2005 | Rouxel | .......................... | 714/1 |

OTHER PUBLICATIONS

Chaikalis et al., "Reconfiguration Between Soft Output Viterbi and Log Maximum A Posteriori Decoding Algorithms", 1st Intl. Conf. on 3G Mobile Communication Technologies, May 2000, pp. 316-320.*
Robertson et al., "A Comparison of Optimal and Sub-Optimal MAP Decoding Algorithms Operating in the Log Domain" IEEE ICC 95, Jun. 1995, pp. 1009-1013.*
Wang et al., "A Unified Structure of the Trellis-Based Soft-Output Decoding Algorithms for Turbo Codes" IEEE ISIT 2001, Jun. 2001, p. 319.*
Chen, J., et al., "Bi-Directional SOVA Decoding for Turbo-Codes", IEEE Communications Letters, vol. 14, No. 12, Dec. 2000, pp. 405-407.*

* cited by examiner

*Primary Examiner*—Stephen M. Baker

(57) ABSTRACT

A turbo decoder iteratively decodes a received, encoded signal with one or more constituent decoders employing a simplified log-maximum a posteriori (SMAP) decoding algorithm. The SMAP decoding algorithm calculates reliability information as a log likelihood ratio for a log-MAP algorithm using a reduced set of path metrics recursively updated based on maximum likelihood recursion. Updated extrinsic information for a subsequent decoding may be derived from the LLR calculated by the SMAP decoding algorithm.

21 Claims, 2 Drawing Sheets

TURBO DECODER EMPLOYING SIMPLIFIED LOG-MAP DECODING

BACKGROUND OF THE INVENTION

1. Field of the Invention

The present invention relates to decoding of encoded and transmitted data in a communication system, and, more particularly, to decoding algorithms in a turbo decoder.

2. Description of the Related Art

Maximum likelihood (ML) and maximum a posteriori (MAP) algorithms are employed for processing a channel output signal applied to a receiver. ML and MAP algorithms may be used for both detection (to reconstruct estimates for transmitted symbols) and decoding (to reconstruct user data). A ML algorithm, such as a Viterbi algorithm, provides a maximum likelihood estimate of a state sequence of a finite-state, discrete-time Markov process observed in noise. Similarly, a MAP algorithm provides a maximum a posteriori estimate of a state sequence of a finite-state, discrete-time Markov process observed in noise. Both ML and MAP algorithms employ a trellis corresponding to possible states (portion of received symbols or data in the sequence) for each received output channel sample per unit increment in time (e.g., clock cycle).

A trellis diagram may represent states, and transitions between states, of the Markov process spanning an interval of time. The number of bits that a state represents is equivalent to the memory of the Markov process. Probabilities are associated with each state (sometimes called a state metric) and each transition between states (sometimes called a branch metric) within the trellis. Probabilities are also associated with each decision for a sample in the sequence, also referred to as "reliability information".

A processor implementing a MAP algorithm computes reliability information in the form of log-likelihood ratio (LLR) reliability values $L_i$ using $\alpha$ values (forward state probabilities for states in the trellis and also known as a forward state metric or recursion) and $\beta$ values (reverse state probabilities in the trellis and also known as a backward state metric or recursion), as described subsequently. The $\alpha$ values are associated with states within the trellis, and these $\alpha$ values are stored in memory. The processor using a MAP algorithm then computes values of $\beta$, and $\alpha$ values are subsequently retrieved from memory to compute the final output LLR values.

A sequence of information bits $$M = \{m_i\}_{i=0}^{K-1}$$

may be defined, where K is the frame size or block of encoding. An encoder, such as a convolutional encoder of rate r=1/2 and alternate puncturing, may be employed to generate an encoded sequence $$X = \{x_i, p_i\}_{i=0}^{K-1}$$

from M, where $x_i = m_i$ for a systematic code and $p_i$ may be parity (e.g., Hamming code) bits. The encoded sequence X might then be transmitted (e.g., with polarity of bit 0="1" and bit 1="−1") through a channel with additive white Gaussian noise (AWGN) with variance $\sigma^2 = (N_o/2)$ using, for example, binary phase-shift keyed (BPSK) modulation. A receiver may receive a sequence $$Y = \{y_i, t_i\}_{i=0}^{K-1},$$

where $y_i = x_i\sqrt{E_b} + n_i$ and $t_i = p_i\sqrt{E_b} + n_i$, where $E_b$ is the energy of a bit.

Extrinsic information may be generated at the receiver, and may be defined as the sequence $$Z = \{z_i\}_{i=0}^{K-1},$$

where $z_i$ is as given in equation (1):

$$z_i = \log\frac{p(m_i = 1)}{p(m_i = -1)}, \tag{1}$$

where p(a=b) is the probability that "a" equals "b", and the probability of $m_i$, $p(m_i)$, is as given in equation (2):

$$p(m_i) = \frac{e^{m_i z_i/2}}{e^{-z_i/2} + e^{z_i/2}}. \tag{2}$$

As described previously, a receiver may form a trellis of states if an ML or MAP decoding algorithm is employed. The variable $S_i$ is defined as a state of the trellis (from a set of possible states $\{S_i^p\}_{p=0}^{M-1}$) of the Markov process at time i, $y_i$ is defined as the noisy channel output sample at time i corresponding to encoded data, $t_i$ is defined as the noisy channel output sample at time i corresponding to the parity bit, and the sample sequence Y is defined as the sequence of length K of noisy channel output samples $$\{y_i, t_i\}_{i=0}^{K-1}.$$

For a MAP algorithm processing a data block of length K, probability functions at time i may be defined for the Markov process as given in equations (3) through (5):

$$\alpha(S_i) = p(S_i = s; Y) \tag{3}$$

$$\beta(S_i) = p(Y|S_i = s) \tag{4}$$

$$\gamma(S_{i-1}, S_i) = p(S_i = s; Y|S_{i-1} = s). \tag{5}$$

where $S_i$ is the state of the Markov process variable at time i, $S_{i-1}$ is the state of the Markov process variable at time i−1, s is the observed state of $S_i$ of the Markov process at time i, and s is the observed state of $S_{i-1}$ of the Markov process at time i−1. In equations (3) and (4), p(a|b) is the probability of "a" given the occurrence "b." The value of $\alpha(S_i)$ in equation (3) is a forward state metric (i.e., the probability of being in a state at time i from a given state at time i−1 given the observed sample), and the value of β($S_i$) in equation (4) is a backward state metric (i.e., the probability of being in a state at time i from a given state at time i+1 given the observed sample). The value of γ($S_{i-1}$,$S_i$) is termed a branch metric and is the probability of a transition from a state $S_{i-1}$ at time i−1 to state $S_i$ at time i.

The forward state metric α($S_i$) and reverse state metric β($S_i$) are calculated based on a recursive update process, with the initial values set to a predefined value such as 1 or 0 using a priori information. Methods to calculate the branch metric γ($S_{i-1}$,$S_i$) are well-known in the art and may be based on a minimized cost function, such as minimum Euclidean distance between the observed channel output $y_i$ and the ideal symbol corresponding to $y_i$. State metrics are updated using the previous state metric values and the branch metric values for transitions from the previous states to the current state.

The LLR value $L_i$ for a user's symbol at time i may then be calculated as given in equation (6):

$$L_i = \log\left(\frac{p(x_i = +1 \mid Y)}{p(x_i = -1 \mid Y)}\right). \quad (6)$$

Defining α($S_i$) and β($S_i$) from equations (3) and (4) as the forward and backward state metrics at time i, respectively, and defining γ($S_{i-1}$,$S_i$) as the branch metric associated with the transition from the state $S_{i-1}$ at time i−1 to state $S_i$ at time i, then the forward recursion for states is given in equation (7):

$$\alpha(S_i) = \sum_{S_{i-1}} \alpha(S_{i-1})\gamma(S_{i-1}, S_i), \quad (7)$$

where the summation is over all transitions from state $S_{i-1}$ at time i−1 to state $S_i$ at time i which are valid transitions. In general, a valid, continuous path P through the trellis might begin and end with a zero state on the trellis. Thus, α($S_o$)=1 when $S_o$=0, and α($S_o$)=0 when $S_o$≠0.

Similarly, the backward recursion for states is given in equation (8):

$$\beta(S_i) = \sum_{S_{i+1}} \beta(S_{i+1})\gamma(S_{i+1}, S_i), \quad (8)$$

where the summation is over all transitions from state $S_{i+1}$ at time i+1 to state $S_i$ at time i which are valid transitions. Similarly, β($S_K$)=1 when $S_K$=0, and β($S_K$)=0 when $S_o$≠0.

Once the forward and backward recursions for states are calculated, equation (6) is employed to generate the LLR value $L_i$ for each user symbol at time i using the relationships of equations (7) and (8). Thus, equation (6) may be re-written as given in equation (9):

$$L_i = \log\frac{\sum_{P \in P^+} p(Y \mid X)}{\sum_{P \in P^-} p(Y \mid X)} = \log\left(\frac{\sum_{S^+} \alpha(S_i)\gamma(S_i, S_{i+1})\beta(S_{i+1})}{\sum_{S^-} \alpha(S_i)\gamma(S_i, S_{i+1})\beta(S_{i+1})}\right) \quad (9)$$

which is known as the log-MAP algorithm. In equation (9), P∈$P^+$ when a continuous path P includes the state at time i corresponding to the user symbol $x_i$="1" ("∈" is the mathematical term indicating "an element of"). Similarly, P∈$P^−$ when a continuous path P includes the state at time i corresponding to the user symbol $x_i$="−1". Also, in equation (9), a transition between a state pair that are elements of $S^+$ is defined as a transition for a state pair at time i corresponding to the user symbol $x_i$="1". A transition between a state pair that are elements of $S^−$ is similarly defined as a transition for a state pair at time i corresponding to the user symbol $x_i$="−1".

The log-MAP algorithm calculation of the LLR value is sometimes approximated, and one such approximation is the max-log-MAP algorithm. The max-log-MAP algorithm calculates LLR $L_i^{(M)}$ at time i as given in equation (10):

$$L_i^{(M)} = \log\frac{\sum_{P \in P^+} p(Y \mid X)}{\sum_{P \in P^-} p(Y \mid X)} \approx \log\frac{\max_{P^+} p(Y \mid X)}{\max_{P^-} p(Y \mid X)}. \quad (10)$$

To simplify the computations, a MAP algorithm (e.g., log-MAP, max-log-MAP) might be modified by substituting A($S_i$)=log (α($S_i$)), B($S_i$)=log (β($S_i$)), and C($S_{i-1}$,$S_i$)=log (γ($S_{i-1}$,$S_i$)) into the equations (7), (8), and (9). The forward and backward recursions of the MAP algorithm may be described as in equations (11) and (12):

$$A(S_i) = \max_{S_{i-1}} *\{A(S_{i-1}) + C(S_{i-1}, S_i)\} \quad (11)$$

$$B(S_i) = \max_{S_{i+1}} *\{B(S_{i+1}) + C(S_i, S_{i+1})\} \quad (12)$$

where max*(x, y) is defined as max(x, y)+log (($e^{-|x-y|}$)+1). Note that equations (11) and (12) may include more than two terms in the max*( ) operator, indicated by the set notation "{ }", so a max*(x, y, . . . , z) operation may be performed as a series of pairs of max*(•,•) calculations. Max (x, y) is defined as the "max term" and log(($e^{-|x-y|}$)+1) is defined as the "logarithmic correction term."

SUMMARY OF THE INVENTION

In accordance with exemplary embodiments of the present invention, a turbo decoder iteratively decodes a received, encoded signal with one or more constituent decoders employing a simplified log-maximum a posteriori (SMAP) decoding algorithm. The SMAP decoding algorithm calculates reliability information as a log likelihood ratio (LLR) for a log-MAP algorithm using state and path metrics recursively updated based on maximum likelihood recursion. Updated extrinsic information for a subsequent decoding may be derived from the LLR calculated by the SMAP decoding algorithm.

In accordance with an exemplary embodiment of the present invention, decoding of channel samples to generate decoded data includes, for a given time instant, updating forward and backward state metrics of a trellis having corresponding states for decoded channel samples using only one or more surviving paths based on a method of maximum likelihood (ML) sequence detection. Reliability information for decoded channel samples is calculated from the updated forward and backward state metrics based on a log-maximum a posteriori (log-MAP) decoding algorithm, wherein the reliability information is calculated using only the one or more surviving paths through the trellis corresponding to valid decoded data values.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
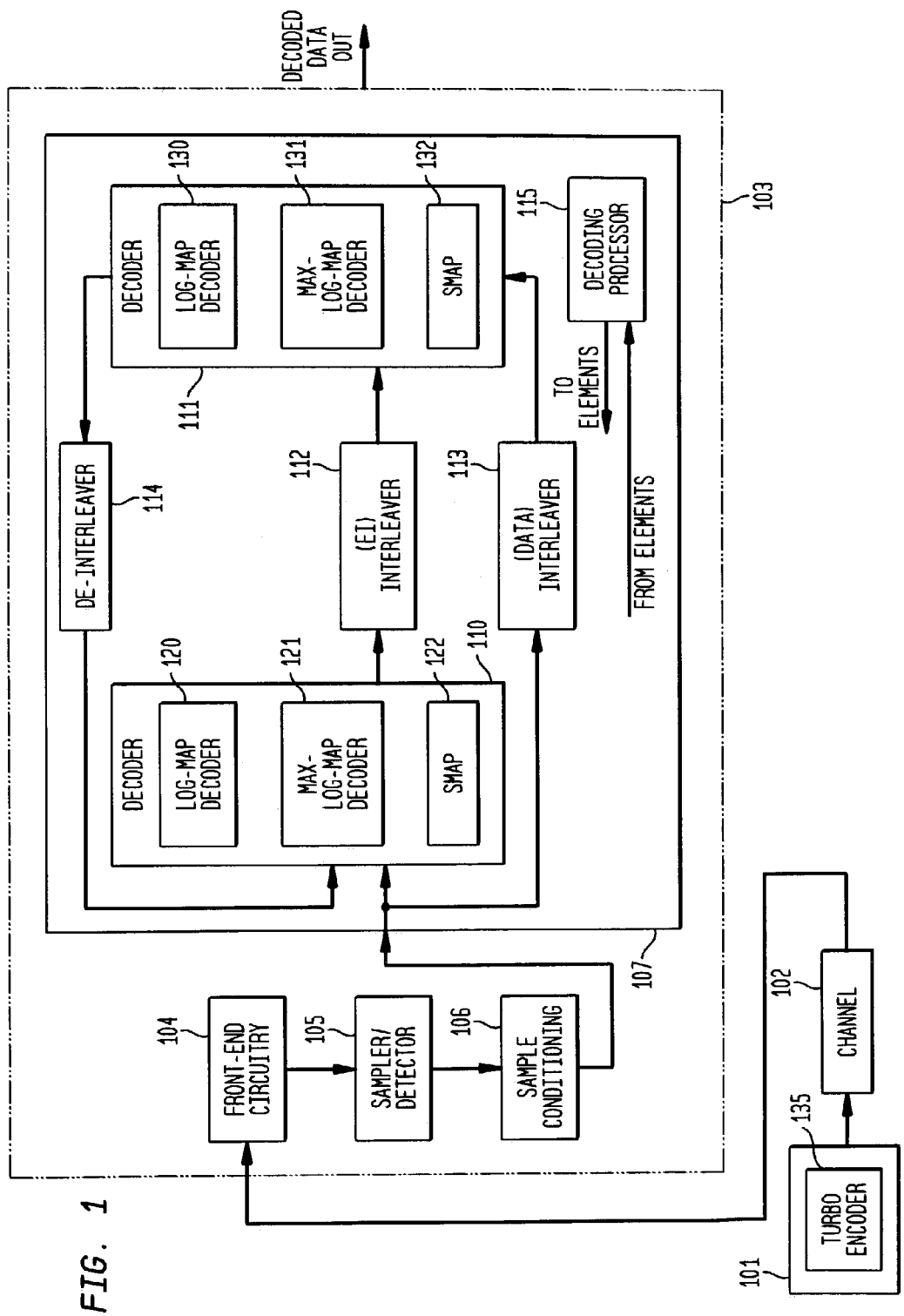
FIG. 1 shows a system including a receiver having a turbo decoder employing a simplified log-MAP decoding algorithm in accordance with an exemplary embodiment of the present invention.

FIG. 1 shows transmitter 101 passing an encoded and modulated signal through channel 102 to receiver 103. Transmitter 101 includes systematic turbo encoder 135 performing parallel concatenation of two identical constituent convolutional encoders separated by an interleaver. Each constituent convolutional encoder employs a recursive systematic code (RSC). For example, a sequence of information bits $$M = \{m_i\}_{i=0}^{K-1}$$

may be defined, where K is the frame size, or block, of encoding. Turbo encoder 135, which may be a convolutional encoder of rate r=1/2 and alternate puncturing, may be employed to generate an encoded sequence $$X = \{x_i, p_i\}_{i=0}^{K-1}$$

from M, where $x_i=m_i$ for a systematic code and $p_i$ may be parity or hamming code bits.

The encoded information bits, or data, are transmitted as a modulated signal through channel 102, such as a magnetic recording channel or wireless communication channel. The encoded sequence X might be transmitted with polarity of bit 0="1" and bit 1="−1", and might be transmitted through channel 102 with additive white Gaussian noise (AWGN) having variance $\sigma^2=(N_o/2)$. Encoded sequence X is transmitted, for example, with BPSK modulation. While not shown explicitly in FIG. 1, transmitter 101 includes components and other systems well known in the art to modulate and transfer the signal to the channel.

Receiver 103 includes front-end circuitry 104, sampler/detector 105, sample conditioning module 106, and turbo decoder 107. Receiver may receive a sequence $$Y = \{y_i, t_i\}_{i=0}^{K-1},$$

where $y_i=x_i\sqrt{E_b}+n_i$, $t_i=p_i\sqrt{E_b}+n_i$, and $E_b$ is the energy of a bit. Front-end circuitry 104 may be employed to receive and demodulate the signal from the channel. Sampler/detector 105 samples the signal received from channel 102 and detects peaks to generate output channel samples. Sample conditioning module 106 might be employed for any number of functions which may include, but are not limited to, signal-to-noise ratio (SNR) estimation, scaling of sample values prior to decoding by turbo decoder 107, sampling (timing) synchronization/compensation, and equalization.

Turbo encoder 107 employs an SMAP decoding algorithm operating in accordance with one or more embodiments of the present invention, as described subsequently. Turbo decoder 107 is employed by receiver 103 to reconstruct the user information or data from the output channel samples. Turbo decoder 107 might also employ a turbo decoding scheme based on one or more MAP other decoding algorithms.

Turbo decoder 107 includes constituent decoders 110 and 111, (data) interleaver 113, (extrinsic information (EI)) interleaver 113, de-interleaver 114, and decoding processor 115. Decoding processor 115 is coupled to the various elements of turbo decoder 107 (shown in the FIGURE as arrows to/from decoding processor 115). Turbo decoder 107 employs iterative decoding, (i.e., repetitively decoding the sequence of channel output samples with two or more iterations) with each iteration comprising a series of constituent MAP decoding operations. Each constituent MAP decoding operation of the iteration corresponds to a constituent encoding operation of the transmitter 101. Each of decoders 110 and 111 applies the corresponding constituent MAP decoding operation during an iteration.

In turbo decoding, each constituent MAP decoding operation generates i) soft decisions for received user bits and ii) a set of LLR values corresponding to the soft decisions. Information generated by one constituent MAP decoding may be used as extrinsic information (a priori information about a bit decision of another decoding) by the next constituent MAP decoding operation. Consequently, the input data stream Y from sample conditioning 106 and extrinsic information from de-interleaver 114 are applied to decoder 110, which decodes the input data stream Y into soft decisions for the decoded data as well as updated extrinsic information from the constituent decoding. The updated extrinsic information includes two components: the original a priori information and new, a posteriori information from this decoding operation.

Since the turbo encoder 135 separates the constituent encodings with an interleaver, at the receiver, the input data stream Y is interleaved by (data) interleaver 113, and the updated extrinsic information from decoder 110 is interleaved by (EI) interleaver 112. Decoder 111 decodes the interleaved input data stream Y from (data) interleaver 113 using the interleaved extrinsic information from (EI) interleaver 112. Decoder 111 generates soft decisions for the decoded data as well as newly updated extrinsic information, completing the current iteration of turbo decoder 107. The newly updated extrinsic information is de-interleaved by de-interleaver 114, and applied to decoder 110 for the next iteration. For the first iteration, the extrinsic information $Z=\{z_i\}$ applied to decoder 110 may be set to a predefined number, such as $z_i=0$ for $0 \leq i \leq K$.

An iterative decoder might employ a fixed number of iterations of decoding, or might employ early termination of iterative decoding (stopping at an earlier iteration) using a predefined metric, such as SNR or bit-error rate (BER) of the decoded data. The number of iterations for a given implementation might be determined through simulation. Once the iterative decoding process completes, the reliability information is used by decoding processor 115 to make hard decisions for the decoded data.

An exemplary embodiment of the SMAP decoding algorithm is as follows. The forward and backward recursion for updating path metrics for log-MAP decoding are given previously in equations (7) and (8), repeated below:

$$\alpha(S_i) = \sum_{S_{i-1}} \alpha(S_{i-1}) \gamma(S_{i-1}, S_i), \text{ and} \quad (7)$$

$$\beta(S_i) = \sum_{S_{i+1}} \beta(S_{i+1}) \gamma(S_{i+1}, S_i). \quad (8)$$

Given the forward and backward recursive computations for updating path metrics for log-MAP decoding of equations (7) and (8), modified forward and backward recursive sequences $\alpha^*(S_i)$ and $\beta^*(S_i)$ in accordance with the exemplary embodiment are given in equations (13) and (14):

$$\alpha^*(S_i) = \max_{s_{i-1}} \{\alpha^*(S_{i-1}) \gamma(S_{i-1}, S_i)\} \quad (13)$$

$$\beta^*(S_i) = \max_{s_{i+1}} \{\beta^*(S_{i+1}) \gamma(S_{i+1}, S_i)\}. \quad (14)$$

In general, a valid, continuous path P through the trellis begins and ends with a zero state on the trellis. Thus, $\alpha(S_o)=1$ when $S_o=0$, and $\alpha(S_o)=0$ when $S_o \neq 0$, and, similarly, $\beta(S_K)=1$ when $S_K=0$, and $\beta(S_K)=0$ when $S_o \neq 0$.

For the SMAP decoding algorithm, forward and backward recursions of equations (13) and (14), respectively, are employed with equation (10) to generate the SMAP LLR value $L_i^*$ as given in equation (15):

$$L_i^* = \log\left(\frac{\sum_{S^+} \alpha^*(S_i)\gamma(S_i, S_{i+1})\beta^*(S_{i+1})}{\sum_{S^-} \alpha^*(S_i)\gamma(S_i, S_{i+1})\beta^*(S_{i+1})}\right) = \log\frac{\sum_{P \in P^+(Surviving)} p(Y|X)}{\sum_{P \in P^-(Surviving)} p(Y|X)} \quad (15)$$

where in the right-hand log expression a path P is an element of the set of paths $P^+$(Surviving) if the set of states of path P includes $\{S: m_i = x_i = \text{"+1"}\}$ covering all paths starting and ending with the zero state, and a path P is an element of the set of paths $P^-$(Surviving) if the set of states of path P includes $\{S: m_i = x_i \text{"-1"}\}$ covering all paths starting and ending with the zero state.

As shown by the right-hand log expression in equation (15), the forward recursion is analogous to implementing a maximum likelihood (ML) sequence algorithm (e.g., Viterbi algorithm) through a trellis with path trimming. The backward recursion is similarly analogous to ML sequence detection, where the ML detection runs through the trellis in reverse after the frame of samples is received. Consequently, the exemplary SMAP decoding algorithm covers all surviving paths through the trellis, which is a smaller set of paths than the set of paths considered by the prior art log-MAP LLR calculation of equation (10). Reducing the set of paths considered by SMAP decoding algorithm allows for fewer computations when generating forward and backward recursions.

As is known in the art, the p(Y|X) term may account for the extrinsic information Z for a ML sequence algorithm, and so the term is modified to become the probability p({Y, Z}|X) of equation (16):

$$p(\{Y, Z\}|X) = \left(\frac{1}{\sqrt{2\pi}\,\sigma}\right)^{2K} \left(\prod_{i=0}^{K-1} \frac{1}{e^{z_i/2} + e^{-z_i/2}}\right) \quad (16)$$

$$e^{-\left(\frac{1}{2\sigma^2}\right)\sum_{i=0}^{K-1}\left\{(y_i - x_i\sqrt{E_b})^2 + (t_i - p_i\sqrt{E_b})^2\right\}} e^{\frac{1}{2}\sum_{i=0}^{K-1} m_i z_i}$$

and path metrics pm for paths in $P^+$(Surviving) and $P^-$(Surviving) are as given in equations (17) and (18):

$$pm_{P^+(Surviving)} = \left(\frac{1}{\sqrt{2\pi}\,\sigma}\right)^{2K}\left(\prod_{i=0}^{K-1}\frac{1}{e^{z_i/2}+e^{-z_i/2}}\right) e^{-\frac{\left(y_i+\sqrt{E_b}\right)^2}{2\sigma^2} + \frac{1}{2}z_i} \quad (17)$$

$$e^{-\frac{\left(t_i - p_i\sqrt{E_b}\right)^2}{2\sigma^2} - \frac{1}{2\sigma^2}\sum_{j \neq i}\left\{(y_j - x_j\sqrt{E_b})^2 + (t_j - p_j\sqrt{E_b})^2\right\} + \frac{1}{2}\sum_{j \neq i} m_j z_j}$$

$$pm_{P^-(Surviving)} = \left(\frac{1}{\sqrt{2\pi}\,\sigma}\right)^{2K}\left(\prod_{i=0}^{K-1}\frac{1}{e^{z_i/2}+e^{-z_i/2}}\right) e^{-\frac{\left(y_i - \sqrt{E_b}\right)^2}{2\sigma^2} - \frac{1}{2\sigma^2}z_i} \quad (18)$$

$$e^{-\frac{\left(t_i - p_i\sqrt{E_b}\right)^2}{2\sigma^2} - \frac{1}{2\sigma^2}\sum_{j \neq i}\left\{(y_j - x_j\sqrt{E_b})^2 + (t_j - p_j\sqrt{E_b})^2\right\} + \frac{1}{2}\sum_{j \neq i} m_j z_j}$$

Turbo decoder 107 iteratively decodes the input data, and as described previously, each decoder (e.g., each of decoders 110 and 111) receives updated extrinsic information from a previous decoding. Generation of updated extrinsic information is now described. Each LLR value $L_i^*$ that is calculated by a SMAP decoder may be decomposed into three components: a component that is a function of the observed symbol $y_i$, the input (a priori) extrinsic information applied to the decoder, and the updated (a posteriori) extrinsic information.

Consequently, for an additive white Gaussian noise (AWGN) channel having noise (power) variance $$\sigma^2 = \frac{N_0}{2}$$

and bit energy $E_b$, decoding by each constituent MAP decoder generates an LLR value $L_i$ for time i, which may be considered to have three components as given in equation (19):

$$L_i^* = \frac{2\sqrt{E_b}}{\sigma^2} y_i + z_i + l_i, \quad (19)$$

where $$L_i^* \in \{L_i^*\}_{i=0}^{K-1}, \text{ and } \{L_i^*\}_{i=0}^{K-1}$$

is the sequence of LLR values for $$\{x_i\}_{i=0}^{K-1}.$$

In equation (19), the right-hand term as a function of sample $y_i$ corresponds to the soft decision, the term $z_i$ is the input a priori extrinsic information from the previous constituent MAP decoding operation (which may be zero for the first iteration), and $l_i$ is the newly generated extrinsic information for the next constituent MAP decoding operation (which is input as $z_i$ for the next decoding). Using the relation of equations (2), (15), (17) and (18), the updated extrinsic information $l_i$ in equation (19) is as given in equation (20):

$$l_i = \log \frac{\sum_{P \in P^+_{(surviving)}} e^{-\left(\frac{(t_i - p_i\sqrt{E_b})^2}{2\sigma^2}\right) - \left(\frac{1}{2\sigma^2}\right)\sum_{j \neq i}\{(y_j - x_j\sqrt{E_b})^2 + (t_j - p_j\sqrt{E_b})^2\} + \frac{1}{2}\sum_{j \neq i} m_j z_j}}{\sum_{P \in P^-_{(surviving)}} e^{-\left(\frac{(t_i - p_i\sqrt{E_b})^2}{2\sigma^2}\right) - \left(\frac{1}{2\sigma^2}\right)\sum_{j \neq i}\{(y_j - x_j\sqrt{E_b})^2 + (t_j - p_j\sqrt{E_b})^2\} + \frac{1}{2}\sum_{j \neq i} m_j z_j}} \quad (20)$$

To simplify computation, the SMAP decoding algorithm may be defined by substituting $a^*(S_i) = \log(\alpha^*(S_i))$, $b^*(S_i) = \log(\beta^*(S_i))$, and $c(S_{i-1}, S_i) = \log(\gamma(S_{i-1}, S_i))$. Equations (13) and (14) are then modified as in equations (21) and (22):

$$a^*(S_i) = \max^*\{a^*(S_{i-1}) + c(S_{i-1}, S_i)\} \quad (21)$$

$$b^*(S_i) = \max^*\{b^*(S_{i+1}) + c(S_{i+1}, S_i)\}. \quad (22)$$

Using the relations of equations (11), (12), (21), and (22), the SMAP decoding algorithm of equation (15) may be modified as in equation (23):

$$L_i^* = \max_{m_j=+1}^*\{a^*(S_{i-1}) + c(S_{i-1}, S_i) + b^*(S_i)\} - \max_{m_j=-1}^* \\ \{a^*(S_{i-1}) + c(S_{i-1}, S_i) + b^*(S_i)\} \quad (23)$$

where $a^*(S_{i-1}) \log \alpha^*(S_{i-1})$, $b^*(S_i) = \log \beta^*(S_i)$, and $c(S_{i-1}, S_i) = \log \gamma(S_{i-1}, S_i)$.

Figure 2:
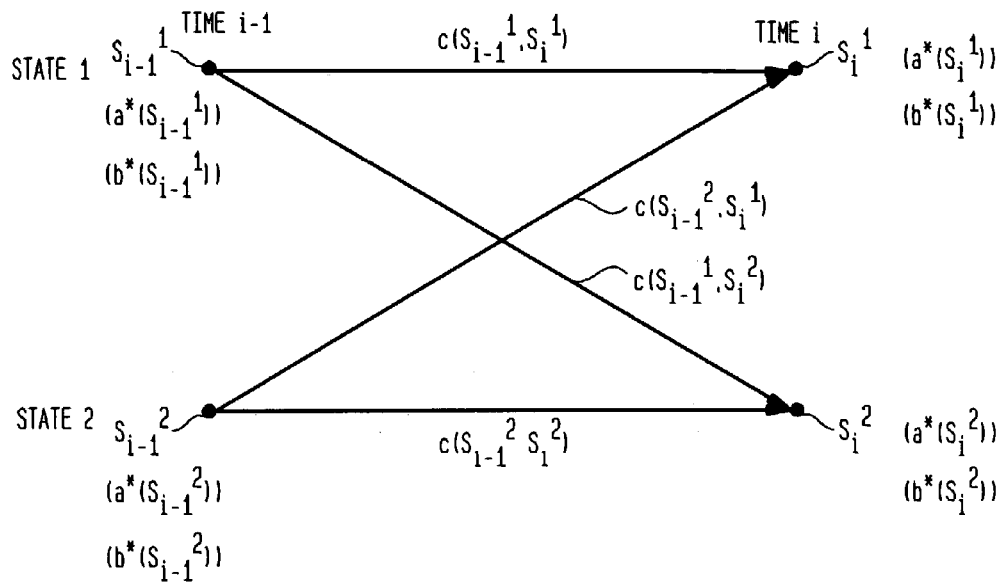
FIG. 2 shows an exemplary 2-state butterfly trellis showing a transition from previous to current states.
Figure 3:
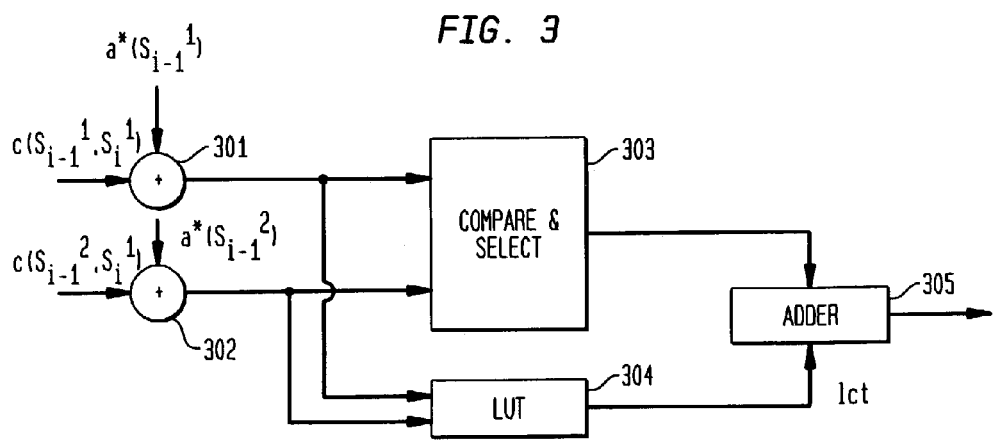
FIG. 3 shows an exemplary add-compare-select circuit implementing a forward recursion calculation for the trellis of FIG. 2.

For example, the simple case of a two-state trellis, also called a butterfly trellis, is shown in FIG. 2. The butterfly trellis of FIG. 2 might be considered a portion of a long sequence of states for a block of K observed channel samples. To calculate the forward and reverse recursion values $a^*(S_i^k)_{k=1,2}$ and $b^*(S_i^k)_{k=1,2}$, where the superscript k identifies state 1 or state 2, each max*(•,•) term of equation (21) and (22) may be implemented using an add-compare-select (ACS) circuit well known in the art. FIG. 3 shows an exemplary ACS circuit 300 implementing a forward recursion in accordance with the SMAP decoding algorithm to update the forward recursion $a^*(S_i^1)$ of state $S_i^1$. ACS circuit 300 includes combiners 301 and 302, compare & select circuit 303, look-up table (LUT) 304, and adder 305.

Combiner 301 combines $a^*(S_{i-1}^1)$ and $c(S_{i-1}^1, S_i^1)$ to generate a first output value, and combiner 302 combines $a^*(S_{i-1}^2)$ and $c(S_{i-1}^2, S_i^1)$ to generate a second output value. Compare & select circuit 303 compares the first and second output values from combiners 301 and 302. Compare & select circuit 303 selects the greater of the first and second output values as the approximated forward recursion $a^*(S_i^1)$.

The first and second output values from combiners 301 and 302 are also provided to LUT 304, which uses the values to address the appropriate logarithmic correction term (lct) value for the approximated forward recursion $a^*(S_i^1)$. The approximated forward recursion $a^*(S_i^1)$ and lct value are added in adder 305 to generate the forward recursion $a^*(S_i^1)$. For some implementations, the lct value may be ignored either during some iterations or ignored entirely, depending on the given implementation design and system performance objectives, to reduce circuit complexity In practice, the computations for forward and backward recursion updates have relatively high memory requirements. Techniques known in the art, such as truncation or windowing, may be employed to reduce memory requirements. Truncation may be employed to scale or reduce the path and state metric values, while windowing resets the path and state metric values periodically on frame boundaries. Such techniques include, for example, non-truncated windowing, single-side truncated windowing, or dual-side truncated windowing. A given implementation of an embodiment of the present invention might employ one or more truncation or windowing techniques. Since the SMAP decoding algorithm is a linear decoding algorithm, similar to max-log-MAP and Viterbi algorithms, a given implementation might not require soft scaling and SNR estimation of input samples.

Turbo decoder 107 might employ switching between different decoding algorithms, such as between log-MAP, SMAP, and max-log-MAP decoding algorithms, to improve decoding performance. Such switching may occur between iterations, or between constituent decoding operations, based on a metric, such as BER or SNR. Consequently, each constituent decoder of turbo decoder 107 may comprise an optional log-MAP decoder and an optional max-log-MAP decoder. As shown in FIG. 1, decoder 110 is configured with optional log-MAP decoder 120 and optional max-log-MAP decoder 121 in addition to SMAP decoder 122. Decoder 111 is similarly configured with optional log-MAP decoder 130 and optional max-log-MAP decoder 131 in addition to SMAP decoder 132. Switching operation between the different decoders might be controlled by decoding processor 115 based on performance metrics, such as SNR, bit-error rate (BER), that might be calculated on-line or off-line through simulation.

A receiver having a turbo decoder employing an SMAP decoding algorithm in accordance with exemplary embodiments of the present invention may provide the following advantages. First, reducing the number of computations reduces the power consumption of a given implementation. Second, reducing the number of computations reduces the overall memory requirements for a given implementation.

While the present invention is described with respect to various equations and expressions, the present invention is not limited to the described equations and expressions. One skilled in the art may modify the various equations described herein. For example, such modifications may include, but are not limited to, i) multiplying by a constant to shift or scale the values, ii) accounting for other random variables of related stochastic processes during the detection and decoding process, iii) substitution of approximations for quantities in the equations, and iv) accounting for noise characteristics, bit or symbol shape/dispersion, inter-symbol interference, encoding, and/or modulation techniques used to transmit the encoded data through the channel.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A computer-implemented method of decoding channel samples corresponding to a signal transmitted through a channel to generate decoded data, the method comprising the steps of:

for a given time instant, (a) updating forward and backward state metrics of a trellis having corresponding states for decoded channel samples using only one or more surviving paths based on a method of maximum likelihood (ML) sequence detection;

(b) calculating reliability information for decoded channel samples from the updated forward and backward state metrics based on a log-maximum a posteriori (log-MAP) decoding algorithm, wherein the reliability information is calculated using only the one or more surviving paths through the trellis corresponding to valid decoded data values; and (c) decoding the channel samples based on the calculated reliability information to generate the decoded data.

2. The invention of claim 1, wherein, for step a), the forward state metric $\alpha^*(S_i)$ and the backward state metric $\beta^*(S_i)$ are updated between states $S_i$ at instants i−1 and i, and at instants i+1 and i by the relations:

$$\alpha^*(S_i) = \max_{s_{i+1}}\{\alpha^*(S_{i-1})\gamma(S_{i-1},S_i)\}$$

$$\beta^*(S_i) = \max_{s_{i+1}}\{\beta^*(S_{i+1})\gamma(S_{i+1},S_i)\},$$

where max(x,y) is the mathematical operator defined as the maximum value of x and y, and $\gamma(S_{i-1},S_i)$ is the branch metric between states $S_{i-1}$ and $S_i$.

3. The invention of claim 1, wherein, for step b) the reliability information is log likelihood ratio (LLR) information, a LLR $L_i^*$ for observed sample $y_i$ as decoded data $x_i$ at time instant i is calculated by the relation:

$$L_i^* = \log\left(\frac{\sum_{S^+} \alpha^*(S_i)\gamma(S_i, S_{i+1})\beta^*(S_{i+1})}{\sum_{S^-} \alpha^*(S_i)\gamma(S_i, S_{i+1})\beta^*(S_{i+1})}\right) = \log\frac{\sum_{P\in P^+ (Surviving)} p(Y|X)}{\sum_{P\in P^- (Surviving)} p(Y|X)}.$$

4. The invention of claim 1, wherein the method is embodied in a processor of an integrated circuit.

5. The invention of claim 1, wherein, for step a), the forward state metric $\alpha^*(S_i)$ and the backward state metric $\beta^*(S_i)$ are updated between states $S_i$ at instants i−1 and i, and at instants i+1 and i by the relations:

$$a^*(S_i) = \max^*\{a^*(S_{-1}) + c(S_{i-1},S_i)\}$$

$$b^*(S_i) = \max^*\{b^*(S_{i+1}) + c(S_i,S_{i+1})\},$$

where max*(x,y) is a mathematical operator defined as max(x, y)+log $((e^{-|x-y|})+1)$, $a^*(S_i)=\log(\alpha^*(S_i))$, $b^*(S_i)=\log(\beta^*(S_i))$, $c(S_{i-1},S_i)=\log(\gamma(S_{i-1},S_i))$, and $\gamma(S_{i-1},S_i)$ is the branch metric between states $S_{i-1}$ and $S_i$.

6. The invention of claim 5, wherein, for step b), the reliability information is log likelihood ratio (LLR) information, and a LLR $L_i^*$ observed sample $y_i$ as decoded data $x_i$ at instant i is calculated by the relation:

$$L_i^* = \max_{m_i=+1}{}^* \{a^*(S_{i-1}) + c(S_{i-1}, S_i) + b^*(S_i)\} - \max_{m_i=-1}{}^* \{a^*(S_{i-1}) + c(S_{i-1}, S_i) + b^*(S_i)\}$$

where the max*( ) operand for $m_i=+1$ corresponds to those valid transitions from a previous state to a current state with channel sample $y_i$ corresponding to decoded data $m_i=+1$ and the max*( ) operand for $m_i=-1$ corresponds to those valid transitions from a previous state to a current state with channel sample $y_i$ corresponding to decoded data $m_i=-1$.

7. The invention of claim 1, wherein the channel samples are decoded using input extrinsic information into the decoded data as soft decisions represented by the corresponding reliability information and updated extrinsic information.

8. The invention of claim 7, wherein the method further comprises the steps of repeating steps (a), (b), and (c) until a predefined metric is met, and setting, when the predefined metric is met, the soft decisions as hard decisions for the decoded data.

9. The invention of claim 1, further comprising the step of generating extrinsic information corresponding to the reliability information.

10. The invention of claim 9, wherein the extrinsic information includes a priori extrinsic information and a posteriori extrinsic information.

11. The invention of claim 10, wherein the a posteriori extrinsic information $l_i$ for sample $y_i$ corresponding to data $x_i=m_i$ with parity bit $t_i$ at instant i is given by:

$$l_i = \log \frac{\sum_{P \in P^+_{(surviving)}} e^{-\left(\frac{(t_i - p_i\sqrt{E_b})^2}{2\sigma^2}\right) - \left(\frac{1}{2\sigma^2}\right) \sum_{j \neq i} \{(y_j - x_j\sqrt{E_b})^2 + (t_j - p_j\sqrt{E_b})^2\} + \frac{1}{2} \sum_{j \neq i} m_j z_j}}{\sum_{P \in P^-_{(surviving)}} e^{-\left(\frac{(t_i - p_i\sqrt{E_b})^2}{2\sigma^2}\right) - \left(\frac{1}{2\sigma^2}\right) \sum_{j \neq i} \{(y_j - x_j\sqrt{E_b})^2 + (t_j - p_j\sqrt{E_b})^2\} + \frac{1}{2} \sum_{j \neq i} m_j z_j}},$$

where $\sigma^2$ is a channel noise variance, $E_b$ is the energy of a bit.

12. The invention of claim 1, wherein the method is embodied in a simplified maximum a posteriori (SMAP) decoding algorithm employed as steps of a constituent decoding method of a turbo decoder.

13. The invention of claim 12, wherein the channel samples are decoded with at least one other decoding algorithm, wherein reliability information in the other decoding algorithm is calculated using at least one non-surviving path.

14. The invention of claim 13, wherein the at least one other decoding algorithm is one of a log-MAP decoding algorithm and a max-log-MAP decoding algorithm having forward and backward state metrics updated based on a log-MAP decoding algorithm.

15. The invention of claim 13, wherein the SMAP decoding algorithm employs one or more of the steps of truncation and windowing to decode the channel samples into decoded data.

16. Apparatus for decoding channel samples corresponding to a signal transmitted through a channel to generate decoded data, the apparatus comprising:
a simplified log-MAP (SMAP) decoder adapted to, for a given time instant,
(a) update forward and backward state metrics of a trellis having corresponding states for decoded channel samples using only one or more surviving paths based on a method of maximum likelihood (ML) sequence detection;
(b) calculate reliability information for decoded channel samples from the updated forward and backward state metrics based on a log-maximum a posteriori (log-MAP) decoding algorithm, wherein the reliability information is calculated using only the one or more surviving paths through the trellis corresponding to valid decoded data values; and
(c) decode the channel samples based on the calculated reliability information to generate the decoded data.

17. The invention of claim 16, further comprising a plurality of add-compare-select (ACS) circuits, wherein each ACS circuit is adapted to generate a corresponding one of the forward and backward state metrics.

18. The invention of claim 16, wherein the apparatus is embodied in an integrated circuit.

19. The invention of claim 16, wherein the SMAP decoder is included in a turbo decoder adapted to iteratively decode the channel samples.

20. The invention of claim 19, wherein, after a predetermined number of iterations, the soft decisions of the last iteration are provided as the decoded data.

21. A computer-readable medium having stored thereon a plurality of instructions, the plurality of instructions including instructions which, when executed by a processor, cause the processor to implement a method of decoding channel samples corresponding to a signal transmitted through a channel to generate decoded data, the method comprising the steps of:
for a given time instant,
(a) updating forward and backward state metrics of a trellis having corresponding states for decoded channel samples using only one or more surviving paths based on a method of maximum likelihood (ML) sequence detection;
(b) calculating reliability information for decoded channel samples from the updated forward and backward state metrics based on a log-maximum a posteriori (log-MAP) decoding algorithm, wherein the reliability information is calculated using only the one or more surviving paths through the trellis corresponding to valid decoded data values; and
(c) decoding the channel samples based on the calculated reliability information to generate the decoded data.

* * * * *

UNITED STATES PATENT AND TRADEMARK OFFICE
CERTIFICATE OF CORRECTION

PATENT NO. : 7,246,295 B2 Page 1 of 1
APPLICATION NO. : 10/412906
DATED : July 17, 2007
INVENTOR(S) : Shuzhan Xu It is certified that error appears in the above-identified patent and that said Letters Patent is hereby corrected as shown below:

In column 12, on line 60, replace "$S_{-1}$" with -- $S_{i-1}$ --.

In column 13, on line 6, replace "$\max_m$" with -- $\max_{m_i}^{\tau}$ --.

Signed and Sealed this

Sixteenth Day of November, 2010

David J. Kappos
*Director of the United States Patent and Trademark Office*